United States Patent
Grimes et al.

(10) Patent No.: US 6,925,588 B2
(45) Date of Patent: Aug. 2, 2005

(54) METHODS AND APPARATUS FOR TESTING DATA LINES

(75) Inventors: G. Keith Grimes, Colorado Springs, CO (US); Gregory W. Achilles, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 400 days.

(21) Appl. No.: 10/328,699

(22) Filed: Dec. 23, 2002

(65) Prior Publication Data

US 2004/0123204 A1 Jun. 24, 2004

(51) Int. Cl.$^7$ .................. G01R 31/28; G01R 19/00; G06F 11/00; H03K 5/153
(52) U.S. Cl. .................. 714/712; 714/740; 327/78; 327/28
(58) Field of Search .................. 714/712, 714, 714/715, 811, 816, 817, 738, 740, 700, 43, 718, 719, 720, 735; 324/522, 523, 524, 532, 533, 534, 627, 620, 613; 327/77, 78, 79, 28, 29, 30, 1

(56) References Cited

U.S. PATENT DOCUMENTS

| | | | | |
|---|---|---|---|---|
| 5,214,654 A | * | 5/1993 | Oosawa | 714/718 |
| 5,243,603 A | * | 9/1993 | Broeren | 714/738 |
| 5,436,910 A | * | 7/1995 | Takeshima et al. | 714/718 |
| 6,609,221 B1 | * | 8/2003 | Coyle et al. | 714/715 |

* cited by examiner

Primary Examiner—Christine T. Tu
(74) Attorney, Agent, or Firm—Duft, Bornsen & Fishman LLP

(57) ABSTRACT

Systems and methods for testing data lines to determine signal degradation in the data lines. A system includes a signal generator for generating a test pattern and for transferring the test pattern through the data lines. The system also includes an analyzer communicatively connected to the data lines to determine degradation of the test pattern in the data lines. The signal generator generates and transfers a first test pattern through the data lines. The first test pattern includes a first portion having a first polarity and a second portion having a second polarity. The signal generator then generates and transfers a second test pattern through the data lines in response to transferring the first test pattern. The test patterns may be repeated one or more times to determine cross talk caused by inductive coupling between data lines and additive reflections.

20 Claims, 4 Drawing Sheets

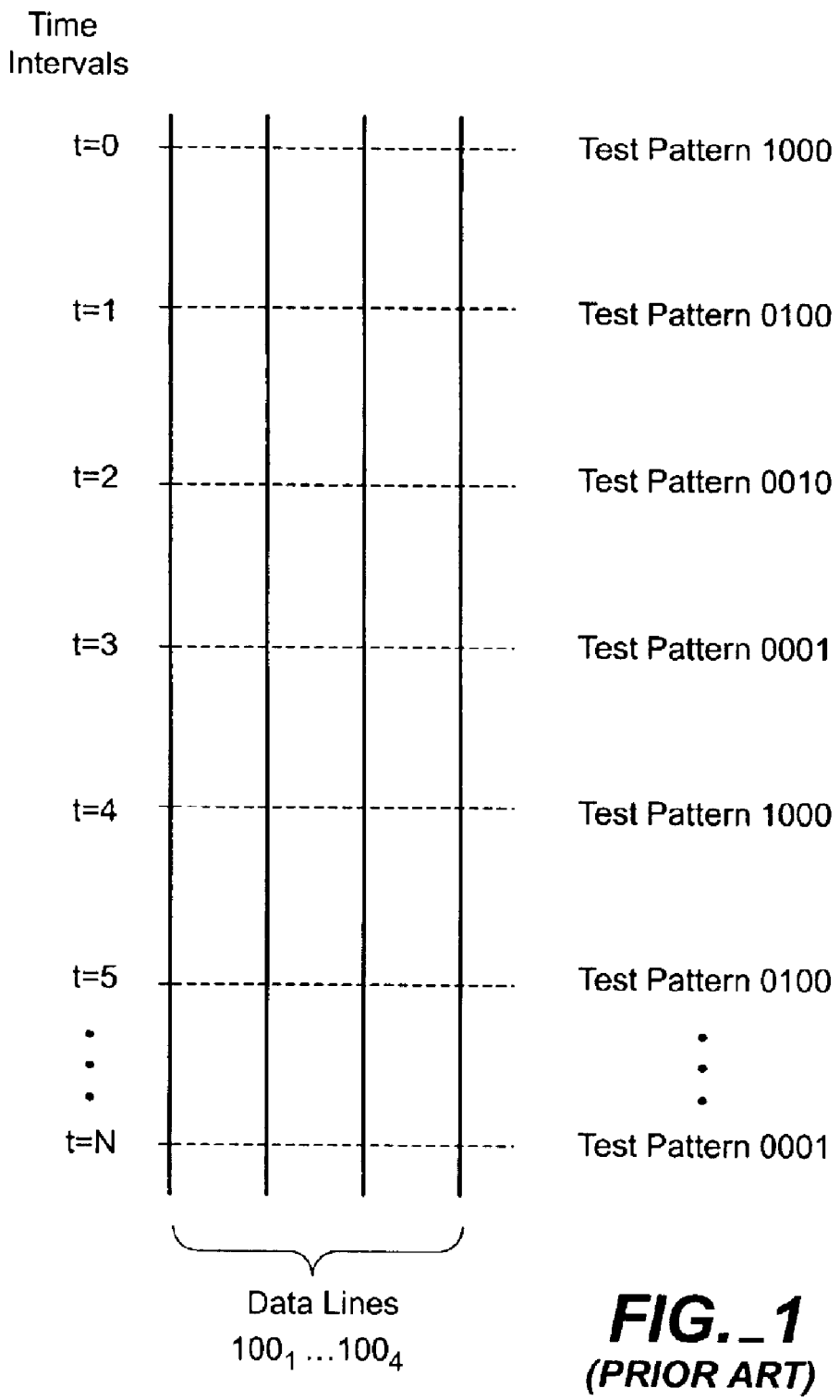
FIG._1 (PRIOR ART)

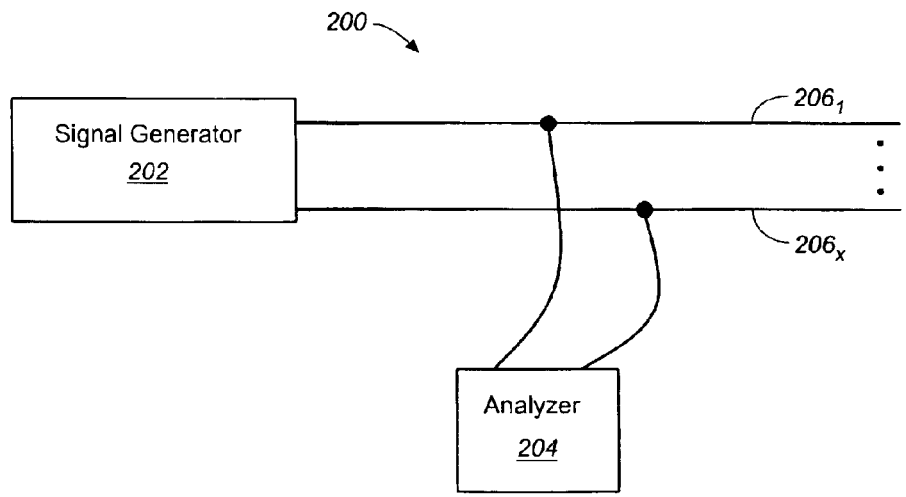
FIG._2
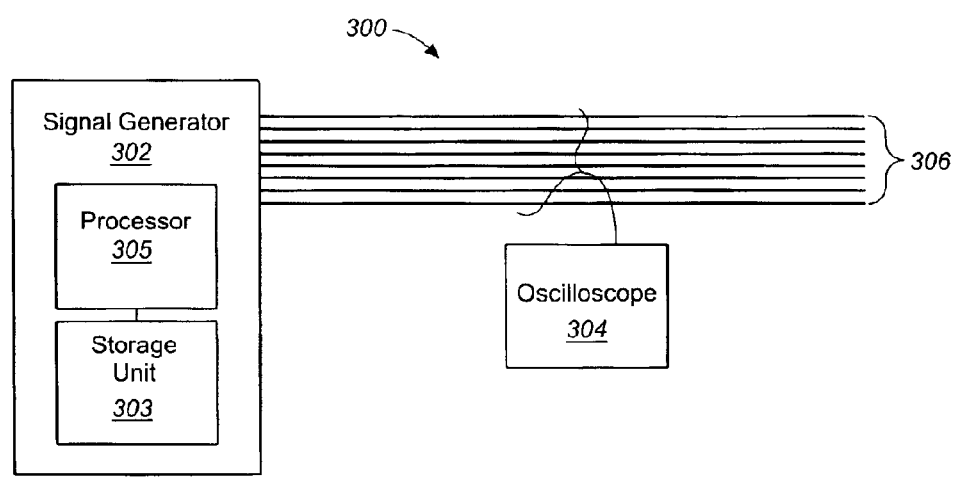
FIG._3

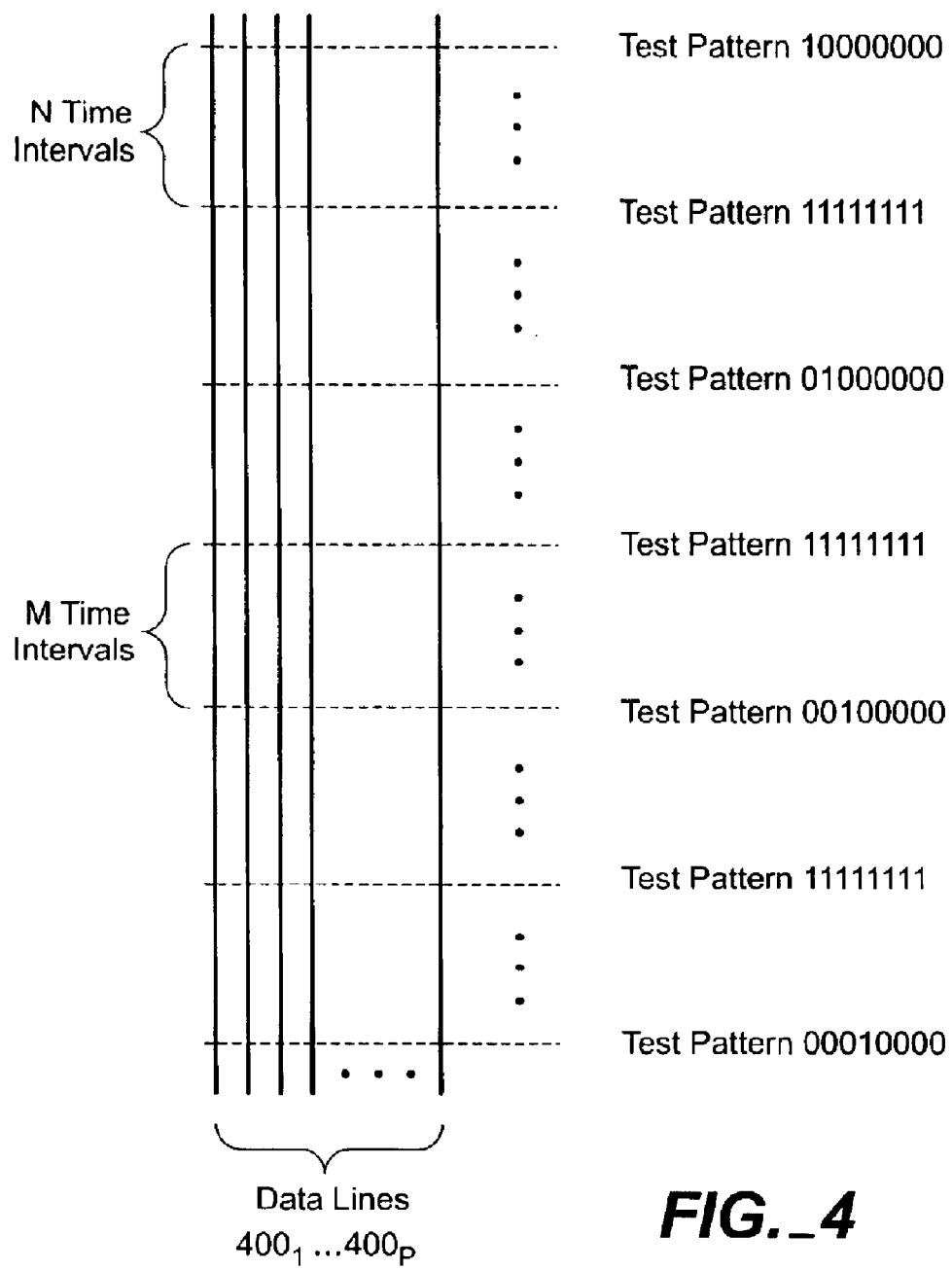
FIG._4

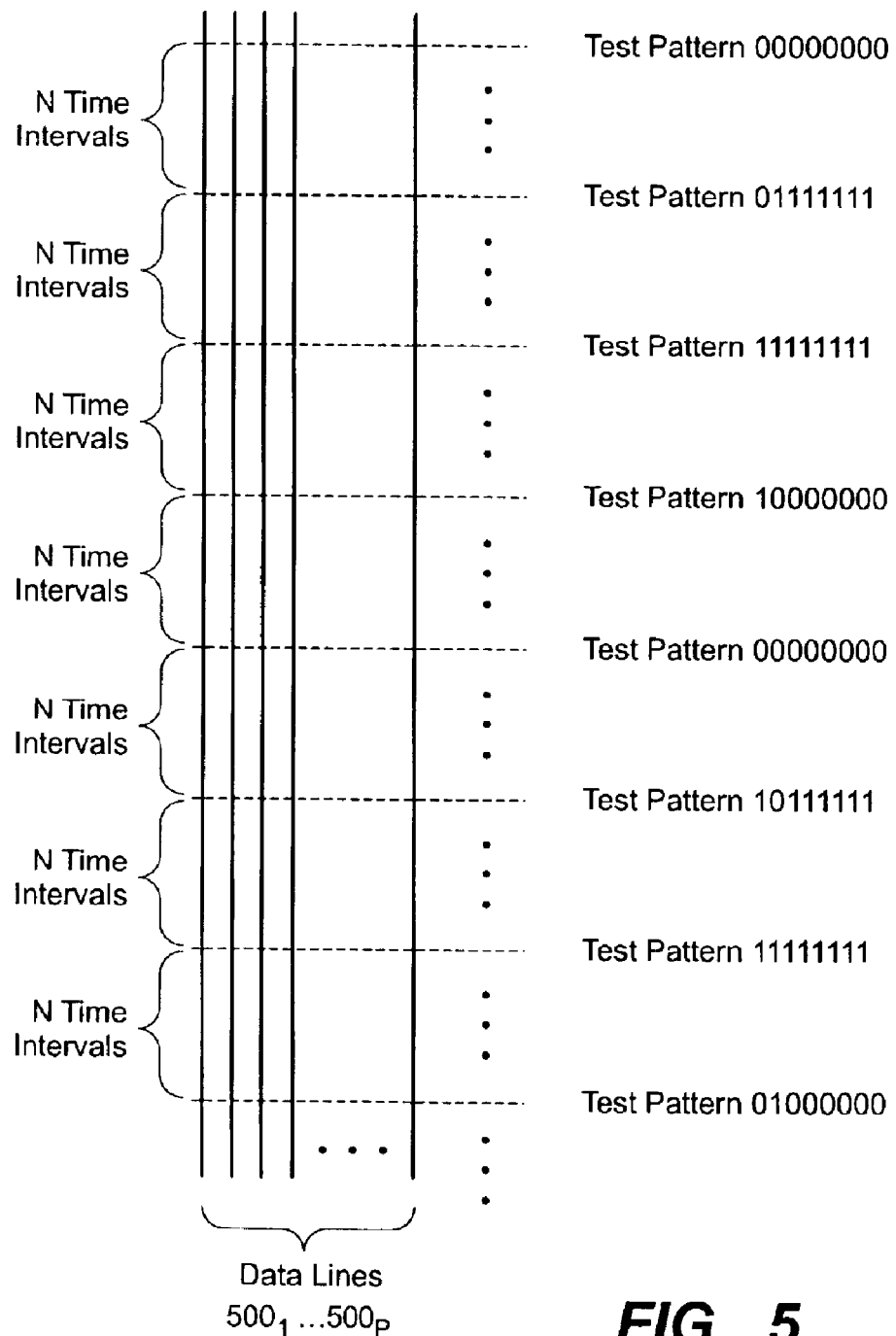
FIG._5

METHODS AND APPARATUS FOR TESTING DATA LINES

BACKGROUND OF THE INVENTION

1. Field of the Invention

The present invention is generally directed toward testing data lines. More specifically, the present invention relates to generating and transferring a test pattern through the data lines to detect signal degradation.

2. Discussion of Related Art

Many electronic devices use data lines to transmit data from one device to another. Examples of data lines are those found in a data bus. A data bus is a cluster of data lines typically configured for transferring digital data in parallel between electronic devices, such as microprocessors. Other examples of data lines may include Printed Circuit Board (PCB) traces that interconnect electronic devices attached to the PCB. Larger systems that use these data lines often require that the data lines operate relatively error free to prevent data corruption between devices.

Data lines are susceptible to several types of noise that can severely degrade data being transferred. Many times, the data itself being transferred through the data lines produces some of this noise. For example, as data is transmitted over a plurality of data lines, the data can produce additive voltage reflections, particularly in unterminated data lines, such as those often found in Peripheral Component Interconnect (PCI) data buses or data lines with improperly matched impedances. An additive reflection is the reflection of voltage through a data line that adds to other data presently being transferred in that data line. An additive reflection corrupts the presently transferred data by adding positive or negative voltages to that of the data. The data being transferred can also cause inductive coupling between data lines if the data lines are either too close or unsheilded. The inductive coupling produces cross talk between data lines. Cross talk is data of one data line being transferred across other data lines and causes data corruption. Cross talk and additive voltage reflections can each degrade the quality of the data to the point of it being irrecoverable.

Test engineers develop systems for the detecting cross talk and voltage reflections. These systems employ means for simulating extraordinary data transfers. When simulating data transfers, engineers often try to achieve a "worst-case" scenario for the data transfers. For example, an engineer may transfer a series of test patterns through the data lines to produce a so-called worst-case amount of cross talk and reflection in the lines. These test patterns allow an engineer to determine how to reconfigure the data lines and minimize reflections and cross talk. However, the test patterns often produce inconsistent reflections and cross talk that overly task the engineer reconfiguring the data lines.

Some typical test patterns include "walking" a bit of information (i.e., a data bit or an element) through each of the data lines. Walking the data bit is defined as stepping a transfer of data having one voltage level (i.e., the data bit), or polarity, at different time intervals through each of the data lines while transferring data having a second voltage level, or opposite polarity, to any remaining data lines. For example, the data bit of one polarity is transferred to one data line during a first time interval while data bits of an opposite polarity are transferred to the remaining data lines. The data bit of one polarity is then transferred to another data line (e.g., "walked") during the next time interval while the data bits of the opposite polarity are transferred all other remaining data lines. The bit is typically walked through each of the data lines and repeated until the source of the cross talk and/or the reflection can be determined. The data line carrying the bit that is walked is referred to as a victim data line while the other data lines are referred to as aggressor data lines.

The testing method of walking a bit produces inconsistent amounts of cross talk and reflections. This inconsistent cross talk and reflection reduces the effectiveness of isolating causes of such data degrading conditions. As a result, some cross talk and reflections in data lines may still occur and cause problems in a finished product. For example, a computer system employing a data bus that produces cross talk and reflections may experience intermittent data corruption during data transfers. Some occurrences of data corruption will cause catastrophic failures within the computer system and require the computer system to be restarted. Hence, there exists a need for improved systems that test data lines and produce consistent forms of data corruption, such as that caused by cross talk and additive reflections, so that the data corruption can be isolated and/or substantially removed.

SUMMARY OF THE INVENTION

The present invention solves the above and other problems and advances the state of the useful arts by providing apparatus and methods for testing data lines. More specifically, the present invention produces consistent data corruption of test data caused by cross talk and additive reflections in the data lines.

In one exemplary preferred embodiment of the invention, a system alternates between transferring a first test pattern that walks an element (e.g., data bit) through each of the data lines and transferring a second test pattern that toggles all of the data lines to a single polarity. This alternation of these two particular test patterns may produce consistent additive reflections in the data line because the pattern produces a dramatic drain on a power supply that causes the reflections. Typically, walking the element across single victim lines produces the worst-case cross talk and additive reflections of the remaining aggressor lines. The alternation of these two particular test patterns may also produce more consistent cross talk caused by inductive coupling. As such, the testing system may identify problem areas in the data lines so that the data lines can be reconfigured.

In one exemplary preferred embodiment of the invention, a system includes a signal generator for generating a test pattern and for transferring the test pattern through the data lines. The system also includes an analyzer communicatively connected to the data lines to determine degradation of the test pattern in the data lines. The signal generator generates and transfers a first test pattern through the data lines. The first test pattern includes a first portion having a first polarity and a second portion having a second polarity. The signal generator then generates and transfers a second test pattern through the data lines in response to transferring the first test pattern.

In another exemplary preferred embodiment of the invention, the analyzer includes an oscilloscope for determining a worst-case inductive coupling between the data lines and/or a worst-case crosstalk between the data lines.

In another exemplary preferred embodiment of the invention, the system further includes a storage unit for storing software instructions used to generate the test pattern. The signal generator is programmable to process the software instructions to generate the test pattern and to transfer the test pattern through the data lines. The signal generator is adapted to generate and transfer the first element through one of the data lines while generating and transferring said remaining elements of the second polarity through all other remaining said data lines. The signal generator is also adapted to generate and transfer the first element through all of said data lines in response to generating and transferring the first element through said one of the data lines.

In another exemplary preferred embodiment of the invention, the signal generator is adapted to generate and transfer the first element and the remaining elements N number of times. The signal generator is also adapted to generate and transfer the first element through all of said data lines M number of times in response to generating and transferring the first and said remaining elements, wherein N and M are numbers greater than one.

In another exemplary preferred embodiment of the invention, the data lines include a PCI data bus.

In one exemplary preferred embodiment of the invention, a method includes steps of transferring a first test pattern through the data lines, the first test pattern including a first portion having a first polarity and a second portion having a second polarity and transferring a second test pattern through the data lines in response to transferring the first test pattern. The method also includes a step of determining the signal degradation through said data lines in response to both steps of transferring.

In another exemplary preferred embodiment of the invention, the step of transferring the first test pattern includes steps of transferring one element having the first polarity within the first portion of the first test pattern and transferring all remaining elements having the second polarity within the second portion of the first test pattern.

In another exemplary preferred embodiment of the invention, the step of transferring the first test pattern includes a step of transferring the first test pattern N number of times before transferring the second test pattern, and wherein the step of transferring the second test pattern includes a step of transferring the second test pattern M number of times, wherein M and N are numbers greater than one.

In another exemplary preferred embodiment of the invention, the method further includes steps of changing a position of said one element to correspond to a different data line of said data lines, and repeating the steps of transferring the first and second test patterns.

In another exemplary preferred embodiment of the invention, the step of transferring the second test pattern includes a step of transferring a plurality of elements of the second polarity.

In one exemplary preferred embodiment of the invention, a method includes steps of: transferring a first test pattern through the data lines N number of times, the first test pattern including a first data bit of a first polarity within a plurality of data bits of the first test pattern and all remaining data bits of a second polarity within the plurality of data bits of the first test pattern, wherein N is a number in a range from 2 to 5, inclusive; transferring a second test pattern through the data lines said N number of times in response to transferring the first test pattern, the second test pattern consists of data bits of the first polarity; and determining the signal degradation of the first and second test patterns through said data lines in response to both steps of transferring, the signal degradation including noise from additive reflections and noise from inductive coupling of the data lines, wherein the data bus is a PCI data bus.

In another exemplary preferred embodiment of the invention, the method further includes steps of: inverting polarity of the first test pattern; inverting polarity of the second test pattern; changing a position of the first data bit of the first test pattern to correspond to a different data line of said data lines; and repeating the two steps of transferring.

Advantages of the system include improved detections of cross talk and additive reflections within data lines by producing consistent cross talk and additive reflections within those data lines. Other advantages include cost and time savings in error detection of finished products. For example, as data errors due to cross talk and additive reflections are detected, they can be substantially eliminated in final products. Removing such cross talk and additive reflections lessens the need for post development testing and debugging.

BRIEF DESCRIPTION OF THE PREFERRED EMBODIMENTS

FIG. 1 is a prior art test pattern data flow diagram.

FIG. 2 is a block diagram illustrating an exemplary preferred embodiment of the invention.

FIG. 3 is block diagram illustrating another exemplary preferred embodiment of the invention.

FIG. 4 is a test pattern data flow diagram of an exemplary preferred embodiment of the invention.

FIG. 5 is a test pattern data flow diagram of another exemplary preferred embodiment of the invention.

DETAILED DESCRIPTION OF THE PREFERRED EMBODIMENTS

The data diagram shown in FIG. 1 represents a well-known test pattern. In the well-known test pattern, a single bit is walked through each of the data lines $100_1$–$100_4$. As shown, the test pattern consists of:

1000 at t=0
0100 at t=1
0010 at t=2
0001 at t=3, and so on.

Each element of the test pattern thusly corresponds to a transference of voltage through one of the data lines. For example, when the test pattern is initially transferred (e.g., time equal to zero, or t=0), the test pattern that is transferred through the data lines is '1000', with the logical one, or '1', being transferred through the first of four data lines (i.e., data line $100_1$, the victim data line) and logical zeros, or '0', being transferred through the remaining three data lines (i.e., data lines $100_2$, $100_3$, and $100_4$, the aggressor data lines). During the next time interval (e.g., t=1), the '1' is transferred, or walked, through the next data line (i.e., data line $100_2$) while the logical zeros are transferred through the remaining data lines (e.g., 0100). This "walking" of the element of the test pattern is repeated to determine signal degradation of the test pattern, specifically the '1' of the test pattern.

Signal degradation, as used herein, is the amount that an element (e.g., a data bit having a particular voltage level) deteriorates when transferred through a particular victim data line while other elements are being transferred through adjacent aggressor data lines. This signal degradation is caused by a variety of reasons. One of these reasons includes inductive coupling between data lines that are not properly shielded and/or are too closely situated to one another. The inductive coupling causes cross talk between elements being transferred through the data lines. Other reasons for signal degradation include additive reflections of elements transferred through the data lines. An additive reflection is the "bounce" of an element through a data line that adds to other elements being transferred through the data line. A bounced element can either add positive or negative voltage to the other elements. This addition of the bounced element causes the present element to deteriorate from its existing voltage level. Unterminated data lines are particularly sensitive to such additive reflections. However, improperly matched impedance of data lines can also cause additive reflections.

The test pattern of FIG. 1 is used determine signal degradation within data lines $100_1$–$100_4$. However, cross talk and additive reflections resulting from this particular test pattern provide inconsistent data regarding the signal degradation of the test pattern. For example, the cross talk and/or additive reflections that result from transferring the test pattern through the data lines are random and inconsistent. A determination from inconsistent data as to the cause of the signal degradation is, therefore, often challenging, time consuming, and/or inaccurate.

While the invention is susceptible to various modifications and alternative forms, a specific embodiment thereof has been shown by way of example in the drawings and will herein be described in detail. Those skilled in the art will appreciate that the features described below can be combined in various ways to form multiple variations of the invention. As a result, the invention is not limited to the specific examples described below, but only by the claims and their equivalents.

With reference now to the figures and in particular with reference to FIG. 2, an exemplary preferred embodiment of the invention is shown in system 200. System 200 includes signal generator 202, analyzer 204, and data lines $206_1$ . . . $206_X$, where X is a number greater than 1. Signal generator 202 is communicatively connected to data lines $206_1$ . . . $206_X$ to generate and to transfer test patterns through the data lines. Analyzer 204 is communicatively connected to data lines $206_1$ . . . $206_X$ to determine signal degradation of the test patterns in the data lines. Signal generator 202 transfers a first test pattern through the data lines and transfers a second test pattern through the data lines in response to transferring the first test pattern. The first test pattern includes a first portion having a first polarity and a second portion having a second polarity. For example, signal generator 202 sets one or more elements, or data bits, of the first test pattern to a first polarity, such as a logical one, while setting the remaining elements of the first test pattern to a second polarity, such as a logical zero. Signal generator 202 transfers the second test pattern through data lines $206_1$ . . . $206_X$ in response to transferring the first test pattern through the data lines.

FIG. 3 shows another exemplary preferred embodiment of the invention in system 300. System 300 includes signal generator 302 and oscilloscope 304. Signal generator 302 is communicatively connected to data lines 306 for transferring test patterns through the data lines such that oscilloscope 304 can display signal degradation of the test patterns within the data lines. Signal generator 302 includes storage unit 303 for storing software instructions that are used to generate the test patterns. Signal generator 302 also includes processor 305 for processing the software instructions of storage unit 303 to generate and to transfer the test patterns through data lines 306. In one embodiment, the test pattern includes a first element, or data bit, having one polarity in a plurality of elements and remaining elements of the plurality of elements having an opposite polarity, wherein the test pattern is transferred through the data lines by alternating between walking the first element through each of the data lines and toggling each of the data lines to a single polarity. Polarities may be inverted between alternations of the test pattern. For example, the test pattern may be transferred over a four-line data bus with as shown in Table 1 with each bit position corresponding to a data line.

TABLE 1

| Bit0 | Bit1 | Bit2 | Bit3 | Comments |
|---|---|---|---|---|
| 0 | 0 | 0 | 0 | at t = 0 (e.g., all bits toggled to a single polarity) |
| 0 | 1 | 1 | 1 | at t = 1 (e.g., bit being walked at bit position 0) |
| 1 | 1 | 1 | 1 | at t = 2 (e.g., all bits inversely toggled) |
| 1 | 0 | 0 | 0 | at t = 3 (e.g., bit being walked at bit position 0 inverted) |
| 0 | 0 | 0 | 0 | at t = 4 (e.g., all bits inversely toggled) |
| 1 | 0 | 1 | 1 | at t = 5 (e.g., bit being walked at bit position 1) |
| 1 | 1 | 1 | 1 | at t = 6 (e.g., all bits toggled to a single polarity) |
| 0 | 1 | 0 | 0 | at t = 7, and so on (e.g., bit being walked at bit position 1 inverted) |

While being transferred through data lines 306, the test pattern may experience signal degradation. This test pattern, however, may produce consistent results of signal degradation caused by inductive couplings between the data lines and additive reflections of the elements through the data lines. For example, the toggling of all of data lines 306 between transfers of the test pattern causes a rapid drain on a power supply. The rapid drain, in turn, causes significant additive reflections to newly transferred elements within a data line. These significant additive reflections are substantially consistent, or repeatable, and may represent "worst-case" scenario reflections within the data line.

Oscilloscope 304 displays the elements being transferred through data lines 306. Oscilloscope 304, therefore, displays the signal degradation of those elements within the data lines. The consistent results produced by the test pattern are used to make adjustments to data lines 306 to reduce and/or prevent occurrences of such signal degradation. For example, as oscilloscope 304 displays a worst-case cross talk caused by inductive coupling of data lines 306 as influenced by the test pattern, a user can view this cross talk and adjust data lines 306 by shielding the data lines and/or separating the data lines. Since the results are substantially consistent, the user may better identify the cause of the degradation, thereby, saving time in development and testing.

FIG. 4 shows a data diagram of an exemplary preferred test pattern in one embodiment of the invention. In this test pattern, a single element (e.g., a data bit having a first voltage level or polarity, the "single element pattern") of the test pattern is walked through each of data lines $400_1$–$400_P$. However, differing from the test pattern of FIG. 1, this test pattern repeats the single element for N time intervals, where N is a number greater than or equal to one. Additionally, after N time intervals, the single element pattern is interrupted by transferring elements having a single polarity (the "single polarity pattern") that may be either the same or different as that of the single element that is walked through each of data lines $400_1$–$400_P$. The single polarity pattern is transferred through the data lines for M time intervals, where M is a number greater than or equal to one and may equal N. Data lines $400_1$–$400_P$ represent P number of data lines, such as those commonly found in a PCI data bus, where P is a number greater than 1. In this exemplary embodiment, P would equal 8 as illustrated by the number of data bits in the test pattern.

The single polarity pattern causes a rapid drain on a power supply which is useful in producing substantially consistent, or repeatable, crosstalk caused by inductive coupling between data lines $400_1$–$400_P$ and additive reflections of voltage levels through the data lines. The cross talk and additive reflections degrade the single element pattern. However, again differing from the test pattern of FIG. 1, the cross talk and/or additive reflections that are produced are substantially consistent, or repeatable. As such, a user may better identify the cause of the cross talk and/or additive reflections and use known means (e.g., separating, shielding, and matching data lines) to remove and/or isolate such signal degrading problems.

The test pattern of FIG. 4, shows a single exemplary preferred test pattern. Other test patterns that fall within the scope of the invention could be used to produce similar results. For example, a multiple element pattern may be walked through each of data lines $400_1$–$400_P$. Additionally, patterns other than the single polarity pattern may be used to interrupt the single element or multiple element patterns. For example, one single element pattern may be walked in an order that is reverse or staggered from that of another single element pattern. The test patterns discussed herein may be advantageously ported to and used in other testing systems. The test patterns may also be useful in determining signal degradations of other types of data lines.

FIG. 5 shows a data diagram of an exemplary preferred test pattern in the best mode of the invention. In this test pattern, a single element (e.g., a data bit having a first voltage level or polarity, the "single element pattern") of the test pattern is walked through each of data lines $500_1$–$500_P$. This test pattern repeats for N time intervals, where N is a number greater than or equal to one. However, in a preferred embodiment, the single element pattern is repeated between 2 and 5 times, inclusive. After the single element pattern is transferred, it is interrupted by transferring elements having a single polarity (the "single polarity pattern"). The single polarity pattern is typically transferred through the data lines for the same number of time intervals as the single element pattern.

Data lines $500_1$–$500_P$ represent P number of data lines, such as those commonly found in a PCI data bus, where P is a number greater than 1. In this exemplary embodiment, P would equal 8 as illustrated by the number of data bits in the test pattern. Accordingly, the data line in which the single element is walked is considered to be the victim line, while the remaining data lines are considered to be aggressor lines. A single victim line with multiple aggressor lines creates the worst-case inductive coupling and, thus, cross talk noise in the victim line. With the test pattern performing multiple assertions of the single polarity pattern, the test pattern creates noise from reflections that are added to the crosstalk noise. The combined noise is, in essence, the overall worst-case noise in the victim line.

Like the test pattern of FIG. 4, cross talk and/or additive reflections that are produced are substantially consistent, or repeatable. This test pattern typically produces the worst-case cross talk and/or additive reflections. As such, a user may better identify the cause of the cross talk and/or additive reflections and use known means (e.g., separating, shielding, and matching data lines) to remove and/or isolate such signal degrading problems. A test pattern that is opposite in polarity to that shown in FIG. 5 may also provide similar cross talk and/or additive reflections that are repeatable. For example, the test pattern may include a single element pattern of 01111111 and a single polarity pattern of 00000000.

Instructions that are used to generate the test pattern of FIG. 5, as well as the test patterns described in FIGS. 2, 3, and 4 can be stored on storage media. The instructions can be retrieved and executed by a microprocessor, such as processor 305 of FIG. 3. Some examples of instructions are software, program code, and firmware. Some examples of storage media are memory devices, tapes, disks, integrated circuits, and servers. The instructions are operational when executed by the microprocessor to direct the microprocessor to operate in accord with the invention. Those skilled in the art are familiar with instructions and storage media.

Advantages of the system include improved detections of cross talk and additive reflections within data lines by producing consistent cross talk and additive reflections within those data lines. Other advantages include cost and time savings in error detection of finished products. For example, as data errors due to cross talk and additive reflections are detected, they can be substantially eliminated in final products. Removing such cross talk and additive reflections lessens the need for post development testing and debugging.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A system for testing data lines, including:
   a signal generator for generating a test pattern and for transferring the test pattern through the data lines; and
   an analyzer communicatively connected to the data lines to determine degradation of the test pattern in the data lines,
   wherein the test pattern includes a first element of a first polarity in a plurality of elements and remaining elements of the plurality of elements being of a second polarity, wherein the test pattern is transferred through the data lines by alternating between walking the first element through each of the data lines and toggling each of the data lines to a single polarity.

2. The system of claim 1, wherein the analyzer includes an oscilloscope for determining a worst-case inductive coupling between the data lines.

3. The system of claim 1, wherein the analyzer includes an oscilloscope for determining a worst-case crosstalk between the data lines.

4. The system of claim 1, wherein the system further includes a storage unit for storing software instructions used to generate the test pattern, the signal generator being programmable to process the software instructions to generate the test pattern and to transfer the test pattern through the data lines, the signal generator being adapted to generate and transfer the first element through one of the data lines while generating and transferring said remaining elements of the second polarity through all other remaining said data lines and being adapted to generate and transfer the first element through all of said data lines in response to generating and transferring the first element through said one of the data lines.

5. The system of claim 4, the signal generator being adapted to generate and transfer the first element and the remaining elements N number of times, the signal generator being further adapted to generate and transfer the first element through all of said data lines M number of times in response to generating and transferring the first and said remaining elements, wherein N and M are numbers greater than one.

6. The system of claim 1, wherein the data lines include a PCI data bus.

7. The system of claim 1, wherein the signal generator is adapted to:
   invert polarity of the test pattern;
   invert toggling each of the data lines; and
   change a position of the first element to correspond to a different data line of said data lines.

8. A method of testing data lines, including steps of:
   transferring a first signal of a first polarity through one of said data lines while transferring a second signal of a second polarity through all other remaining said data lines;
   transferring the first signal through all of said data lines in response to transferring the first signal of the first polarity through said one of said data lines; and
   determining signal degradation through said data lines in response to both steps of transferring.

9. The method of claim 8, further including a step of repeating both steps of transferring N number of times to detect additive reflections of the first and second signals through the data lines, wherein N is a number greater than one.

10. The method of claim 8, further including steps of:
    transferring the first signal of the first polarity to another of said data lines while transferring the second signal of the second polarity through all other remaining said data lines; and
    transferring the first signal through all of said data lines in response to transferring the first signal of the first polarity through said another of said data lines.

11. The method of claim 8, further including steps of:
    transferring the second signal of the second polarity through one of said data lines while transferring the first signal of a first polarity through all other remaining said data lines;
    transferring the second signal through all of said data lines in response to transferring the second signal of the second polarity through said one of said data lines; and
    determining signal degradation through said data lines in response to both steps of transferring.

12. The method of claim 11, further including a step of repeating both steps of transferring N number of times to detect additive reflections of the first and second signals through the data lines, wherein N is a number greater than one.

13. The method of claim 11, further including steps of:
    transferring the second signal of the second polarity to another of said data lines while transferring the first signal of the first polarity through all other remaining said data lines; and
    transferring the second signal through all of said data lines in response to transferring the second signal of the second polarity through said another of said data lines.

14. A method of testing data lines to determine signal degradation in the data lines, including steps of:
    transferring a first test pattern through the data lines, the first test pattern including a first portion having a first polarity and a second portion having a second polarity;
    transferring a second test pattern through the data lines in response to transferring the first test pattern; and
    determining the signal degradation through said data lines in response to both steps of transferring.

15. The method of claim 14, wherein the step of transferring the first test pattern includes steps of:
    transferring one element having the first polarity within the first portion of the first test pattern; and
    transferring all remaining elements having the second polarity within the second portion of the first test pattern.

16. The method of claim 15, wherein the step of transferring the first test pattern includes a step of transferring the first test pattern N number of times before transferring the second test pattern, and wherein the step of transferring the second test pattern includes a step of transferring the second test pattern M number of times, wherein M and N are numbers greater than one.

17. The method of claim 16, further including steps of:
    changing a position of said one element to correspond to a different data line of said data lines; and
    repeating the steps of transferring the first and second test patterns.

18. The method of claim 14, wherein the step of transferring the second test pattern includes a step of transferring a plurality of elements of the second polarity.

19. A method of testing data lines of a data bus to determine signal degradation in the data lines, including steps of:
    transferring a first test pattern through the data lines N number of times, the first test pattern including a first data bit of a first polarity within a plurality of data bits of the first test pattern and all remaining data bits of a second polarity within the plurality of data bits of the first test pattern, wherein N is a number in a range from 2 to 5, inclusive;
    transferring a second test pattern through the data lines said N number of times in response to transferring the first test pattern, the second test pattern consists of data bits of the first polarity; and
    determining the signal degradation of the first and second test patterns through said data lines in response to both steps of transferring, the signal degradation including noise from additive reflections and noise from inductive coupling of the data lines,
    wherein the data bus is a PCI data bus.

20. The method of claim 19, wherein the method further includes steps of:
    inverting polarity of the first test pattern;
    inverting polarity of the second test pattern;
    changing a position of the first data bit of the first test pattern to correspond to a different data line of said data lines; and
    repeating the two steps of transferring.

* * * * *